United States Patent
Varnica et al.

(10) Patent No.: US 9,391,639 B2
(45) Date of Patent: *Jul. 12, 2016

(54) LDPC MULTI-DECODER ARCHITECTURES

(71) Applicant: MARVELL WORLD TRADE LTD., St. Michael (BB)

(72) Inventors: Nedeljko Varnica, San Jose, CA (US); Gregory Burd, San Jose, CA (US)

(73) Assignee: MARVELL WORLD TRADE LTD. (BB)

( * ) Notice: Subject to any disclaimer, the term of this patent is extended or adjusted under 35 U.S.C. 154(b) by 0 days.

This patent is subject to a terminal disclaimer.

(21) Appl. No.: 14/723,565

(22) Filed: May 28, 2015

(65) Prior Publication Data

US 2015/0263761 A1    Sep. 17, 2015

Related U.S. Application Data (63) Continuation of application No. 14/303,994, filed on Jun. 13, 2014, now Pat. No. 9,048,871, which is a continuation of application No. 13/348,037, filed on Jan. 11, 2012, now Pat. No. 8,756,479.

(60) Provisional application No. 61/432,966, filed on Jan. 14, 2011.

(51) Int. Cl.
  *H03M 13/00* (2006.01)
  *H03M 13/11* (2006.01)
  *H03M 13/37* (2006.01)
  *H03M 13/29* (2006.01)

(52) U.S. Cl.
  CPC ........ *H03M 13/1108* (2013.01); *H03M 13/116* (2013.01); *H03M 13/1117* (2013.01); *H03M 13/1128* (2013.01); *H03M 13/1131* (2013.01); *H03M 13/1137* (2013.01); *H03M 13/2909* (2013.01); *H03M 13/3707* (2013.01)

(58) Field of Classification Search
  CPC ............... H03M 13/1108; H03M 13/1131; H03M 13/2909
  See application file for complete search history.

(56) References Cited

U.S. PATENT DOCUMENTS

| | | | |
|---|---|---|---|
| 7,827,461 B1 | 11/2010 | Low et al. | |
| 8,028,216 B1 | 9/2011 | Yeo et al. | |
| 2007/0033497 A1 | 2/2007 | Shen et al. | |
| 2008/0028274 A1* | 1/2008 | Lin | H03M 13/1108 714/752 |
| 2009/0089642 A1 | 4/2009 | Miles et al. | |

(Continued)

FOREIGN PATENT DOCUMENTS

| | | |
|---|---|---|
| EP | 1 494 358 A2 | 1/2005 |
| WO | 2007001305 A1 | 1/2007 |

OTHER PUBLICATIONS

Guilloud, F et al: "Generic Description and Synthesis of LDPC Decoders," IEEE Transactions on Communications, IEEE Service Center, Piscataway, NJ USA, vol. 55, No. 11 (22 pgs).

(Continued)

*Primary Examiner* — Sam Rizk (57) ABSTRACT

Systems, methods, and other embodiments associated with LDPC decoder architectures are described. According to one embodiment, a method includes decoding codeword bits with a high throughput LDPC decoder and when the decoding of the codeword bits with the high throughput LDPC decoder is unsuccessful, decoding the codeword bits with a low throughput LDPC decoder.

14 Claims, 8 Drawing Sheets

(56) References Cited

U.S. PATENT DOCUMENTS

| | | | |
|---|---|---|---|
| 2009/0282319 A1* | 11/2009 | No | H03M 13/1108 714/780 |
| 2010/0192040 A1* | 7/2010 | Yedidia | H03M 13/1108 714/755 |
| 2011/0029839 A1 | 2/2011 | Zhong et al. | |
| 2013/0139026 A1 | 5/2013 | Blanksby et al. | |

OTHER PUBLICATIONS

Yu Kou et al: "Low-Density Parity-Check Codes Based on Finite Geometries: A Rediscovery and New Results," IEEE Transactions on Information Theory, IEEE Press, USA vol. 47, No. 7 (22 pgs).

* cited by examiner

LDPC MULTI-DECODER ARCHITECTURES

CROSS REFERENCE TO RELATED APPLICATIONS

This patent disclosure is a continuation of U.S. patent application Ser. No. 14/303,994 filed on Jun. 13, 2014, now U.S. Pat. No. 9,048,871; which is a continuation of U.S. patent application Ser. No. 13/348,037 filed on Jan. 11, 2012, now U.S. Pat. No. 8,756,479; which claims the benefit of U.S. Provisional Application No. 61/432,966 filed on Jan. 14, 2011, which are hereby wholly incorporated by reference.

BACKGROUND

The background description provided herein is for the purpose of generally presenting the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

A basic problem in communications and data storage involves determining whether information received at a receiver accurately reflects information transmitted from a transmitter. Conventionally, additional verification bits (e.g., parity bits, cyclic redundancy check bits) have been added to message bits to facilitate improving confidence that a received message matches a transmitted message. The communication/data storage system, therefore typically includes an Error-Correcting Code (ECC). For example, in the encoding process, the codeword of an ECC code is constructed by adding redundancy/check bits to the data field. Low density parity check (LDPC) codes define one type of ECC.

LDPC codes are linear block codes associated with a sparse parity check matrix that can be represented as a bipartite graph. The sparsity refers to a condition where a parity check matrix for an LDPC code may be constrained to have less than a certain number of ones per column and to have less than a certain number of ones per row.

An LDPC decoder receives a vector (received vector), attempts to decode the most likely codeword corresponding to the received vector, and reports on whether the decoder vector is a valid codeword. An LDPC codeword may include message bits and redundancy bits. The redundancy bits may be, for example, parity bits. An LDPC code may be a linear (N,K) block code with K information bits mapped to a codeword of block length N. An LDPC code C can be specified in terms of a low-density (e.g., sparse) N×K binary parity check matrix. While examples are provided in terms of binary codes herein, it should be understood that similar methodologies can be applied to non-binary codes, where the word "bit" is replaced by the word "non-binary symbol". Thus "bit node processing elements" as described and claimed herein may also include processing elements that process non-binary symbols. A codeword can be decoded in an iterative fashion where beliefs are built up about certain bits of the codeword and then those beliefs are passed along to other bits of the codeword via the check equation updates of beliefs. Decoding will continue until the constraints for a codeword have been satisfied, until a maximum number of tries (e.g., iterations through an LDPC decoder) have been attempted, or until other criteria terminate decoding.

Figure 1:
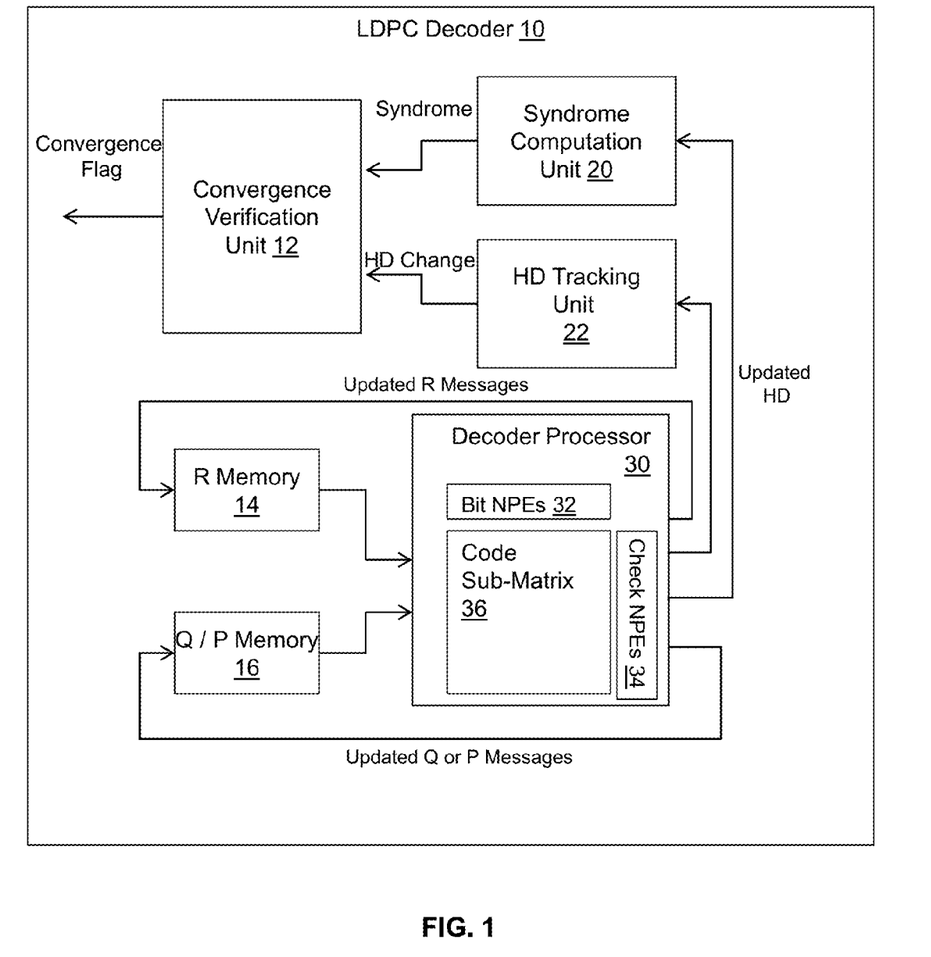
FIG. 1 illustrates one conventional LDPC decoder.

FIG. 1 illustrates one general example of a conventional min-sum LDPC decoder 10. The decoder 10 provides a convergence flag when the convergence verification unit 12 determines that the decoder 10 has converged on a valid codeword. The syndrome and hard-decision (HD) change signals can be combined to determine whether the LDPC decoder 10 has reached convergence. The HD tracking unit 22 and the HD change signal usage is optional. In some architectures, the HD tracking unit 22 and HD change signal may not be needed. The syndrome computation unit 20 and the HD tracking unit 22 may receive an updated HD from a decoder processor 30 that is responsible for processing and/or updating bit nodes and check nodes.

Figure 2:
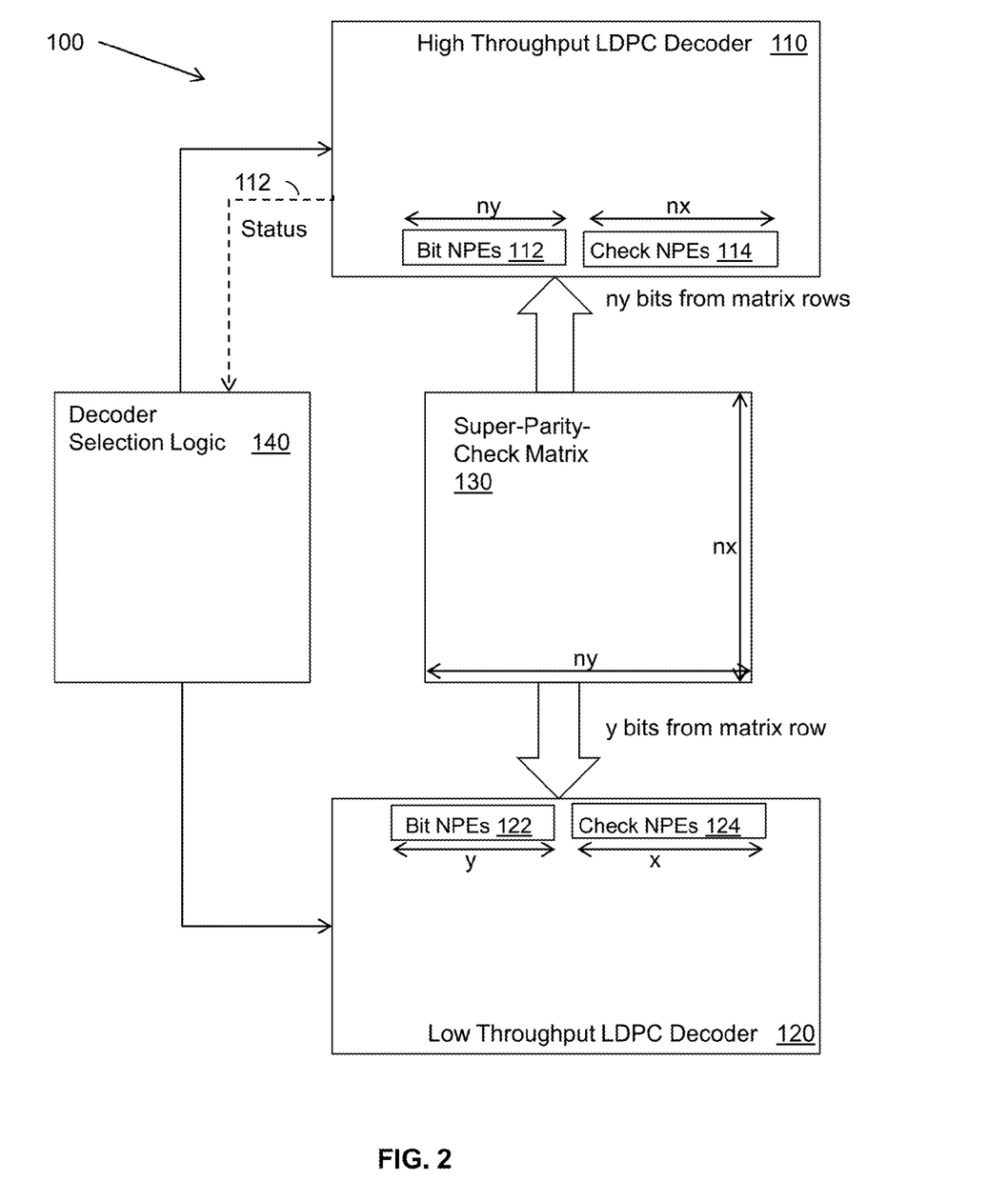
FIG. 2 illustrates one embodiment of an apparatus associated with an LDPC code architecture that supports decoders of different throughput.
Figure 3:
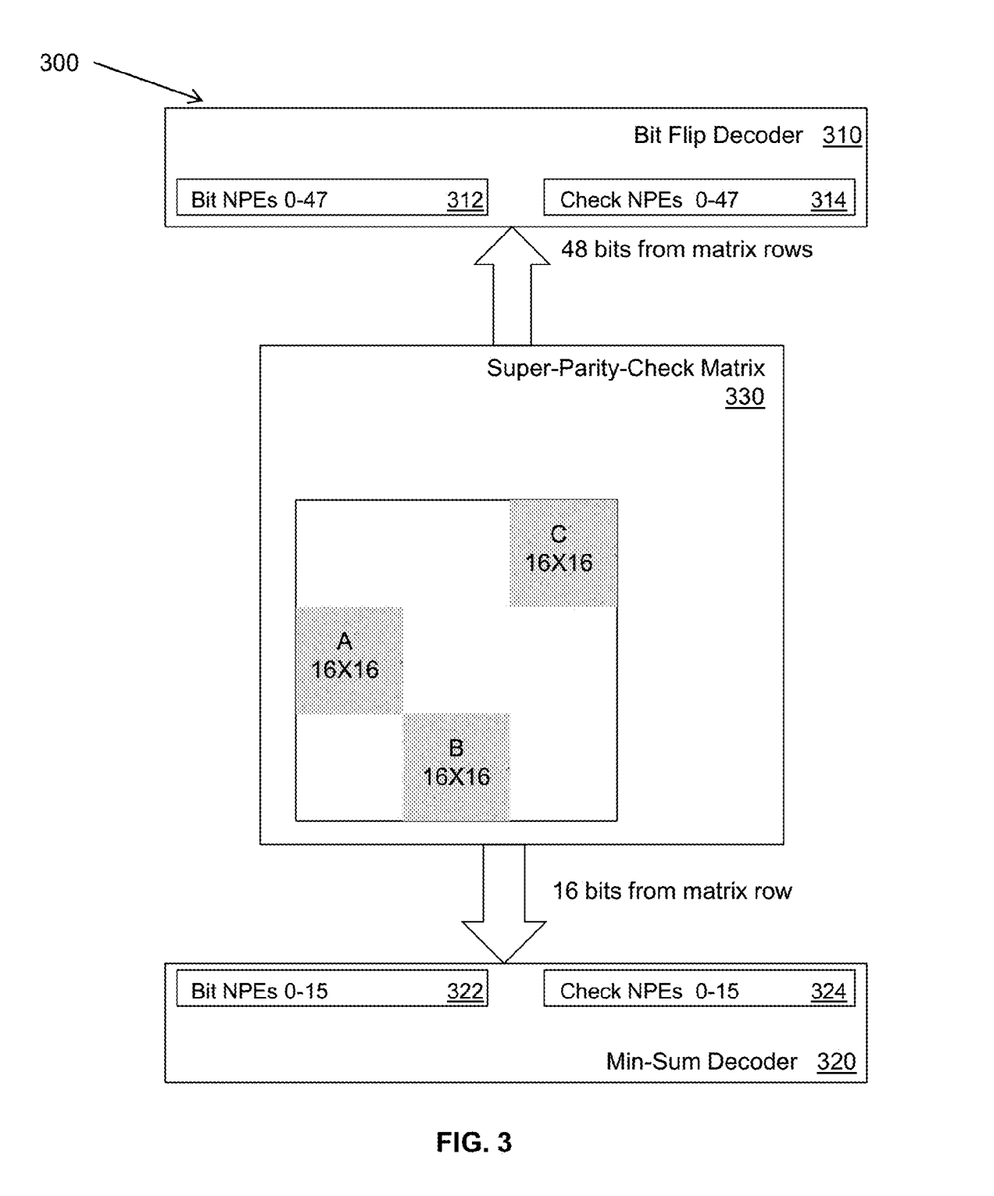
FIG. 3 illustrates one embodiment of an apparatus associated with an LDPC code architecture that supports decoders of different throughput.

The decoder processor 30 includes a code sub-matrix 36 that is a sub-matrix of a larger low-density (e.g., sparse) binary parity check matrix (not shown) that corresponds to the parity check code. The overall LDPC code typically may have dimension N−K by N bits. This code matrix is usually processed partially using the sub-matrix. For example, the sub-matrix 36 has size x by y bits, where x<N−K and y<N. The sub-matrix 36 may be used as a basic processing unit of the code. Such basic processing units may be processed in parallel (e.g., in one clock cycle). For simplicity, only the sub-matrix 36 of the entire LDPC code parity check matrix 36 is shown in FIGS. 2 and 3. For example, the super-parity check matrix, which will be described later, may correspond to the sub-matrix 36 of the LDPC code parity check matrix.

A bit node processing element (NPE) 32 is provided for each column of the code sub-matrix 36, thus there are x bit NPEs. A check NPE 34 is provided for each row of the code sub-matrix 36, thus there are y check NPEs. In some embodiments, processing x may be equal to y. In min-sum decoders, the bit NPEs compute or update bit-to-check messages (Q messages), whereas the check NPEs compute or update check-to-bit messages (R messages). In some implementations, instead of storing Q messages, an a-postieri bit (P message) may be stored. The decoder processor 30 provides updated R messages to an R memory 14 and updated Q or P messages to a Q or P memory 16. The decoder processor 30 receives values from the R memory 14 and the Q or P memory 16.

In another type of LDPC decoder, the messages may be single bit messages. These decoders are often called bit-flip decoders. In one implementation of a bit-flip decoder, the P message for a bit node j ($1 \leq j \leq N$) is a single bit message. This is also the HD value for that bit node. The bit node value can be updated in an iterative fashion, where the check nodes directly connected to the bit node j are polled and, based on these check node values, it is determined whether to flip the value of the bit node j or keep the current value of the bit node j. In this implementation, the R memory stores the check node values, whereas the P memory stores the bit node values (HD values). Thus, the R memory stores the value of the XOR of all the bit node values connected to the check node stored in the R memory.

SUMMARY

In one embodiment an apparatus includes a high throughput LDPC decoder, a low throughput LDPC decoder; and first logic. The first logic is configured to enable decoding of codeword bits by either the high throughput LDPC decoder or the low throughput LDPC decoder based on selection criteria.

In another embodiment, a method includes decoding codeword bits with a high throughput LDPC decoder and when the decoding of the codeword bits with the high throughput LDPC decoder is unsuccessful, decoding the codeword bits with a low throughput LDPC decoder.

In another embodiment a device includes a hard decision memory storing codeword bit values; a previous syndrome memory storing syndrome values from an immediately prior decoding iteration; a current syndrome memory storing syndrome values calculated during a present decoding iteration; and first logic. The first logic is configured to, for a group of n bit nodes storing n bit node bits, in the same decoding iteration: i) access the previous syndrome memory to poll the values of check nodes connected to bit nodes in the group of bit nodes; ii) selectively flip bit node bits based, at least in part, on the values of check nodes stored in the previous syndrome memory; iii) selectively update syndrome values in the current syndrome memory based, at least in part, on new values of the n bit node bits; and iv) selectively update codeword bit values in the hard decision memory based, at least in part, on the new values of the n bit node bits.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Described herein are example systems, methods, and other embodiments associated with LDPC decoder architectures that support decoders of different throughput in the same decoding architecture. In one embodiment, a high throughput LDPC decoder and a low throughput LDPC decoder may be used in the same decoding architecture. The high throughput LDPC decoder may be used as the default decoder while the low throughput LDPC decoder is used when the high throughput LDPC decoder fails to decode a codeword. In this manner, the decoding architecture can benefit from the power and time savings provided by the high throughput LDPC decoder as much as possible while still providing more decoding capability, when necessary, by way of the low throughput LDPC decoder.

Decoder architectures that include decoders of different throughputs are well suited for processing codewords stored on solid state devices, where relatively few errors occur. Since few errors occur, the high throughput LDPC decoder will be almost exclusively. As the solid state device ages, more errors may occur and the low throughput LDPC decoder will be available to continue decoding operations, albeit with higher power consumption and processing time, in those instances when the high throughput LDPC decoder may not be able to accomplish a correction. Since the majority of the time the lower throughput LDPC decoder would not be employed, occasionally running the lower throughput decoder may not significantly affect the overall throughput/power. One way the architectures described herein supports decoders of different throughput is by providing a super-parity-check matrix that can be used by either decoder. This saves cost and space that would be associated with providing a different code matrix for each decoder. In addition, the extra redundancy that would be required to enable a encoder to encode based on two different codes is saved.

With reference to FIG. 2, one embodiment of a decoder architecture 200 is shown that is associated with support for decoders of different throughput. The decoder architecture 200 includes a high throughput LDPC decoder 110 and a low throughput LDPC decoder 120. "Throughput" refers to the number of codeword bits that can be processed in parallel by the decoder. "High" and "low" are used in a relative sense as between the two decoders 110, 120 and do not refer to any specific throughput or throughput range. In one embodiment, the high throughput LDPC decoder is a bit flip decoder and the low throughput LDPC decoder is a min-sum decoder.

The decoder architecture 200 includes a decoder selection logic 140 that selects a decoder for decoding a codeword. The decoder selection logic uses a selection criteria to determine which decoder to select to decode a given codeword. In one embodiment, the selection criteria is a decode success status 112 of the high throughput LDPC decoder 110. Thus, if the high throughput LDPC decoder 110 fails to decode a codeword, the decoder selection logic 140 may select the low throughput LDPC decoder 120 to attempt to decode the codeword that the high throughput LDPC decoder 110 was unable to decode.

The high throughput LDPC decoder 110 includes ny bit NPEs 112 and nx check NPEs 114. The number of bit NPEs and check NPEs corresponds to the throughput of the high throughput LDPC decoder 110. The high throughput LDPC decoder 110 accesses a super-parity-check matrix 130 that is a sparse sub-matrix of an LDPC code having N−K rows and N columns. The super-parity-check-matrix 130 has nx rows and ny columns. As an example, if (N−K)/(nx)=D and if N/(ny)=F, then there are D times F super-parity-check matrices, only one of which, the super-parity-check-matrix 130, is shown in the figures. Some of super-parity-check-matrices may be all-zero circulant matrices.

The super-parity-check matrix 130 can be used by the high throughput LDPC decoder 110 to process ny bit nodes in a single time unit (e.g., clock cycle). Once the high throughput LDPC decoder 110 finishes processing the super-parity-check-matrix 130, it can move on to the next super-parity-check-matrix (not shown), which is the next block of the entire parity check matrix that is of the same size, nx by ny, but typically differs in structure. For example, if N/(ny)=F, it would take F time units (clock cycles) to process one iteration in the high throughput LDPC decoder. The dimensions of the super-parity-check matrix are selected based on the relative throughputs of the high and low throughput LDPC decoders 110, 120.

The low throughput LDPC decoder 120 includes y bit NPEs 122 and x check NPEs 124. Thus the throughput of the low throughput LDPC decoder 120 is 1/n of the throughput of the high throughput LDPC decoder 110. The low throughput LDPC decoder 120 also accesses the super-parity-check matrix 130. However, the low throughput LDPC decoder 120 accesses portions of the super-parity-check matrix in each time unit (e.g., clock cycle) as will be described in more detail with reference to FIG. 3.

FIG. 3 illustrates one embodiment of a decoder architecture 300 that includes a bit flip decoder 310 (e.g., a high throughput LDPC decoder) and a min sum decoder 320 (e.g., a low throughput LDPC decoder). The bit flip decoder 310 has a throughput of 48 bits and thus has 48 bit NPEs (0-47). The bit flip decoder also has 48 check NPEs (0-47). The min-sum decoder has a throughput of 16 bits and thus has 16 bit NPEs (0-15) and 16 check NPEs (0-15). The decoder architecture 300 includes a super-parity-check matrix 330 that is accessed by both the bit flip decoder 310 and the min-sum decoder 320.

In the example shown in FIG. 3, the super-parity-check matrix 330 is constructed of three 16×16 circulant parity check matrices A, B, C as indicated by the shaded boxes in FIG. 3. A circulant matrix is a matrix in which the values of a row are a shifted version of an immediately preceding row. The remainder of the super-parity-check matrix 330 contains zeroes. The three parity check matrices A, B, C are arranged within the super-parity-check matrix 330 in a circulant pattern. It is not necessary that the parity check matrices A, B, C and/or the super-parity-check matrix 330 be circulant matrices, but it may often be desirable. The dimension of the super-parity-check matrix 330 is selected based on the throughput of the bit flip decoder 310 (e.g., 48 bits processed per time unit) while the dimension of the parity check matrices A, B, C are selected based on the throughput of the min-sum decoder 320 (e.g., 16 bits processed per time unit). Other super-parity-check matrices could be constructed with any number of parity check matrices, for example, a super-parity-check matrix with dimension 100×100 could include five 20×20 parity check matrices.

When the bit flip decoder 310 is selected by the decoder selection logic (not shown in FIG. 3, see FIG. 2), the bit flip decoder 310 accesses 48 bits per time unit from the super-parity-check matrix 330. However, those 48 bits connect to the rows in the super-parity-check matrix 330 in a different order. Due to the position of the parity check matrices A, B, C, bits 0-15 connect to rows 16-31 of the super-parity-check matrix 330; bits 16-31 connect to rows 32-47 of the super-parity-check matrix 330; and bits 32-47 connect to rows 0-15 of the super-parity-check matrix 330.

In one embodiment, the positions of the parity check matrices A, B, C within the super-parity-check matrix 330 are stored in the bit flip decoder 310 so that the proper portions of the proper rows may be used for codeword bit processing. If the super-parity-check matrix 330 is circulant with respect to the parity check matrices A, B, C, the positions may be specified by a number that indicates a number of times the parity check matrix in the first row has been shifted (see FIG. 4A). If the parity check matrices A, B, C are circulant, the bit flip decoder may also be provided with a simple numeric indicator for each parity check matrix A, B, C that indicates a number of times the non-zero value in the first row has been shifted in that particular circulant parity check matrix.

If the min-sum decoder 320 is selected for decoding, the min-sum decoder will access 16 columns of the super-parity-check matrix 330 in each time unit. For example, if the min-sum decoder 320 is based on parallel processing of columns, in the first time unit of processing the super-parity-check matrix 330, the min-sum decoder may access columns 0-15 and rows 16-31 corresponding to the parity check matrix A. In the next time unit of processing the super-parity-check matrix 330, the min-sum decoder may access columns 16-31 and rows 32-47 corresponding to the parity check matrix B. In the third time unit of processing the super-parity-check matrix 330, the min-sum decoder may access columns 32-47 and rows 0-15 corresponding to the parity check matrix C. If the parity check matrices A, B, C are circulant, the min-sum decoder may be provided with a simple numeric indicator for each parity check matrix A, B, C that indicates a number of times the non-zero value in the first row has been shifted in that particular circulant parity check matrix.

Figure 4A:
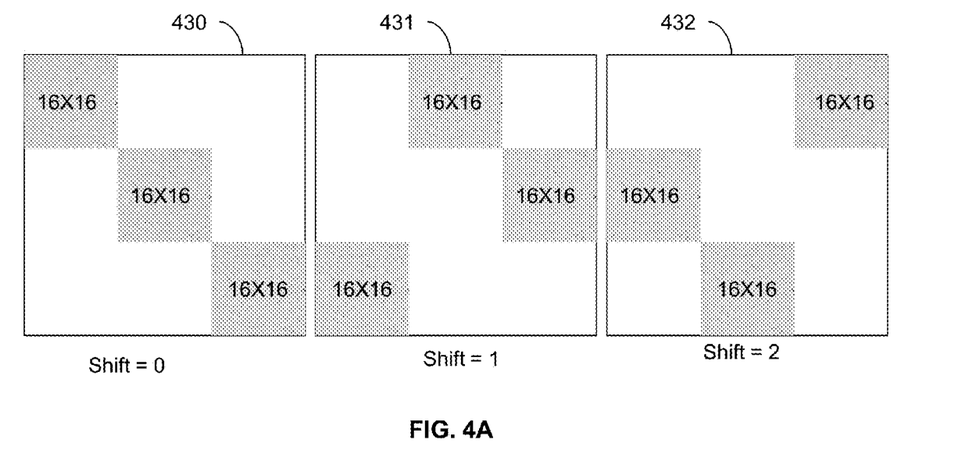
FIGS. 4A and 4B illustrates various embodiments of a code super-matrix associated with an LDPC code architecture that supports decoders of different throughput.
Figure 4B:
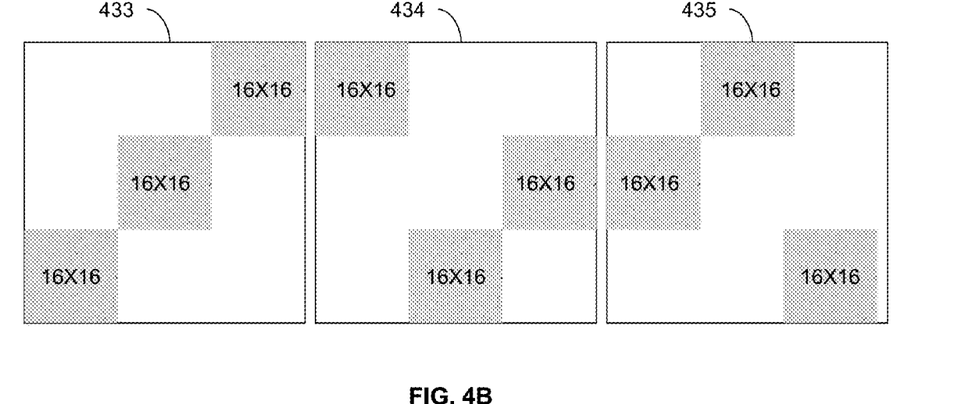

FIG. 4A illustrates three super-parity-check matrices 430, 431, 432 with different arrangements of smaller parity check matrices for the embodiment in which there are three smaller parity check matrices per super-parity-check matrix. The three super-parity-check matrices 430, 431, 432 are circulant with respect to the positions of the smaller parity check matrices. Thus, super-parity-check matrix 430 represents a 0 shift, super-parity-check matrix 431 represents a single shift, and super-parity-check matrix 432 represents a double shift. The shift values 0, 1, 2 can be provided to the high throughput LDPC decoder (e.g., bit flip decoder 310) to specify the positions of the smaller parity check matrices within each super-parity-check matrix. FIG. 4B illustrates an additional three super-parity-check matrices 433, 434, 435 with different arrangements of smaller parity check matrices that are not circulant.

Figure 5:
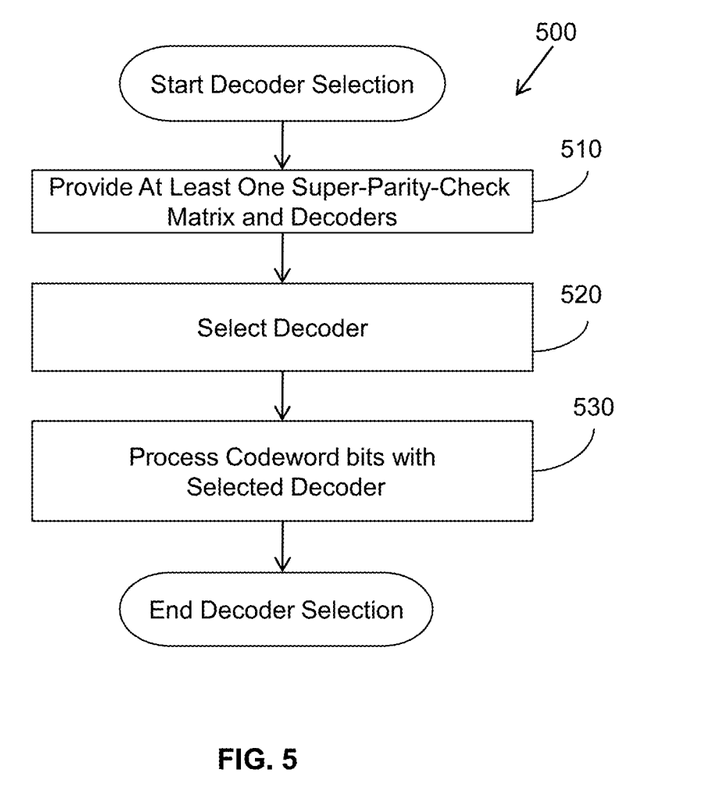
FIG. 5 illustrates one embodiment of a method associated with an LDPC code architecture that supports decoders of different throughput.

FIG. 5 illustrates one embodiment of a decoder selection method 500. The method includes, at 510, providing the entire LDPC parity check matrix that includes at least one super-parity-check-matrix coupled to a low throughput LDPC decoder and a high throughput LDPC decoder. Each of the at least one super-parity-check-matrices corresponds to a portion of an LDPC code and includes n smaller parity check matrices. While typically, more than one super-parity-check matrices are used to process an entire LDPC code, for the purposes of this description, performance of the method with respect to a single super-parity-check matrix is described. The smaller parity check matrices include x rows corresponding to x check node processing elements and y columns corresponding to y bit node processing elements. Thus, the super-parity-check-matrix comprises nx rows corresponding to nx check node processing elements and ny columns corresponding to ny bit node processing elements. While step 510 may be performed only once since the LDPC code matrix is pre-selected, steps 520 and 530 may be repeated for each codeword.

At 520, the method includes selecting one of the low throughput LDPC decoder and the high throughput LDPC decoder for decoding a codeword. At 530, the method includes, processing codeword bits with the selected decoder. When the high throughput LDPC decoder is selected, ny codeword bits corresponding to at least one super-parity-check matrix may be processed in a single time unit to perform a portion of one iteration in the high throughput LDPC decoder. When the low throughput LDPC decoder is selected, y codeword bits corresponding to at least one super-parity-check matrix may be processing in a single time unit to perform a portion of one iteration in the low throughput LDPC decoder. In one embodiment, the method 500 includes selecting the low throughput LDPC decoder to decode the codeword when the high throughput LDPC decoder fails to decode the codeword.

Figure 6:
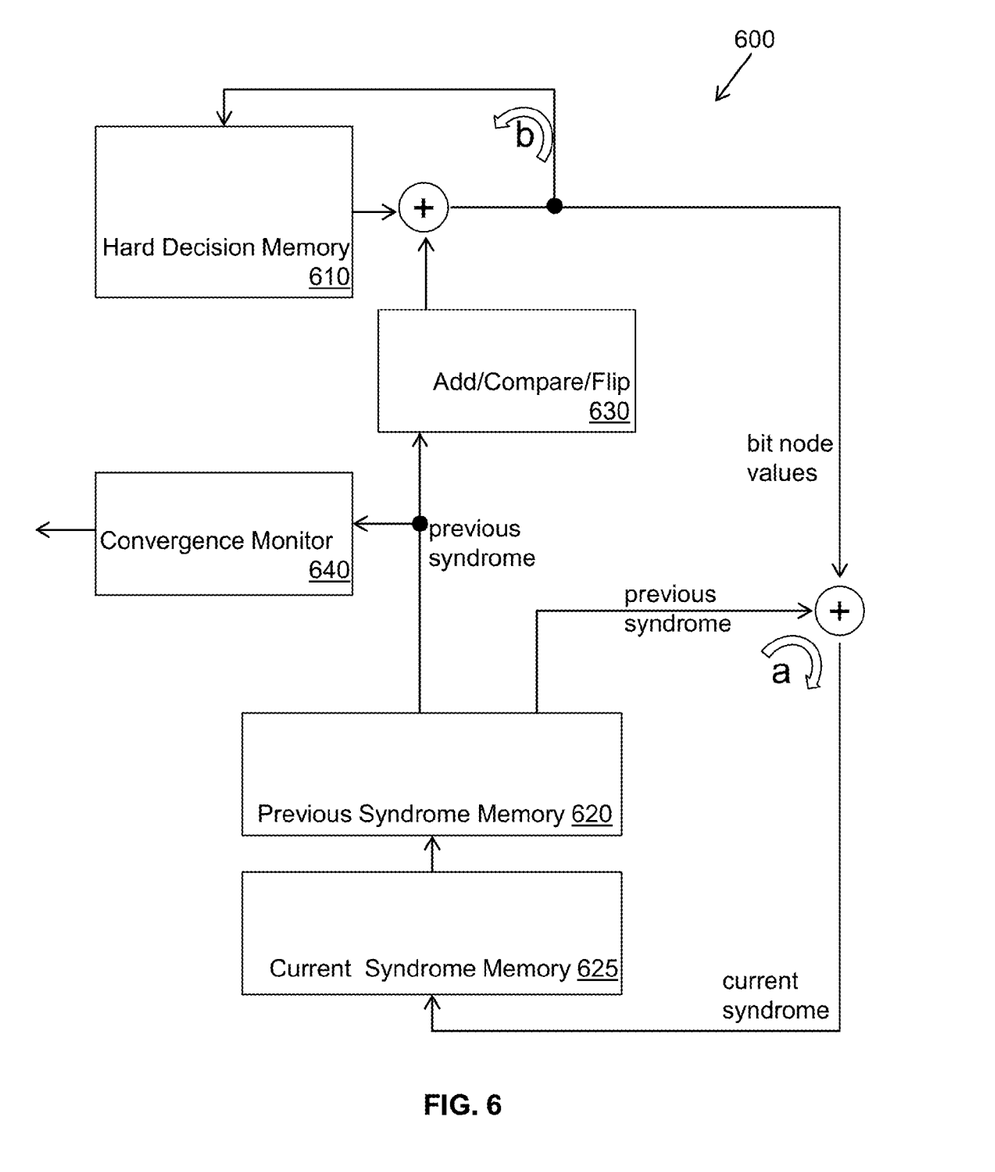
FIG. 6 illustrates one embodiment of an apparatus associated with an LDPC code architecture that supports decoders of different throughput.
Figure 7:
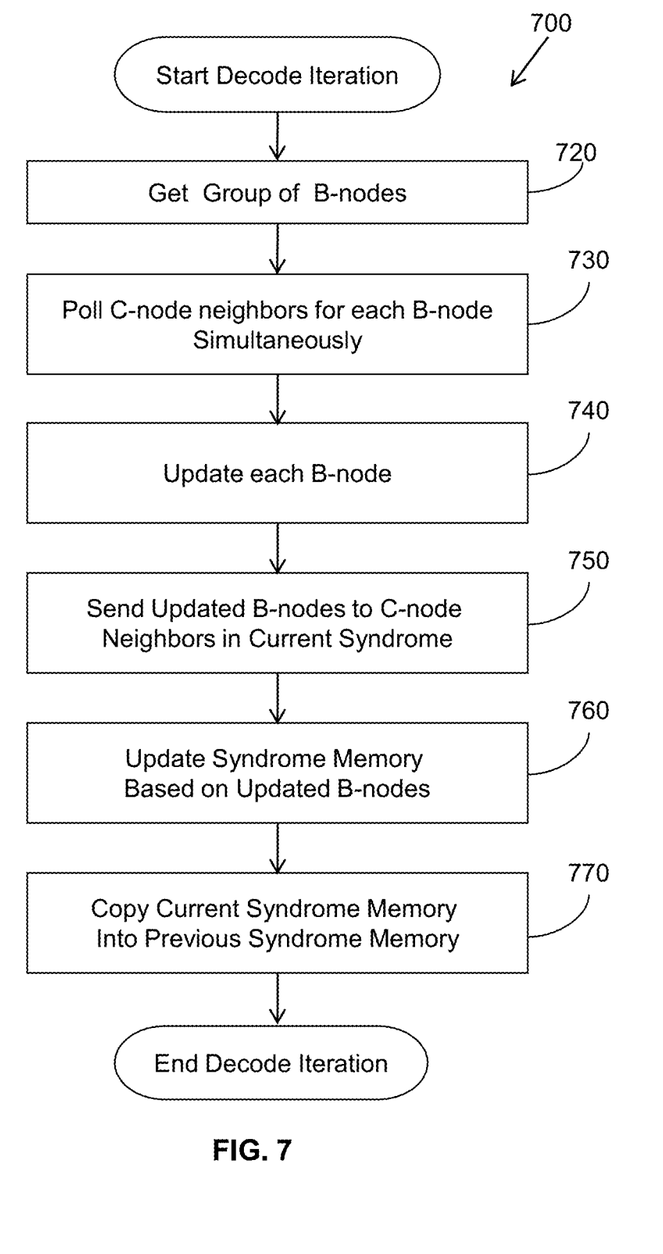
FIG. 7 illustrates one embodiment of a method associated with an LDPC code architecture that supports decoders of different throughput.
Figure 8:
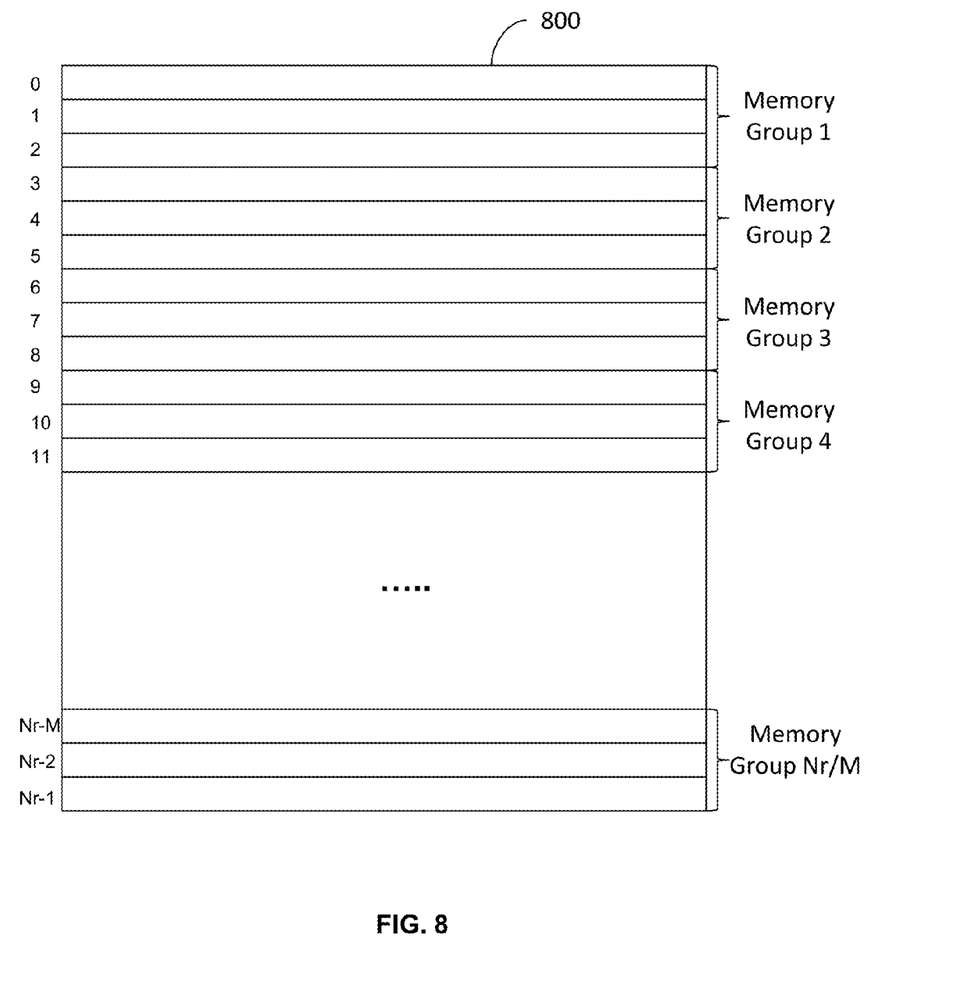
FIG. 8 illustrates one embodiment of an apparatus associated with an LDPC code architecture that supports decoders of different throughput.

As mentioned above, when ny codeword bits are processed in the high throughput decoder, this may correspond to processing one or more super-parity-check matrices in one time unit. FIGS. 6-8 illustrate a bit flip decoder architecture that facilitates processing groups of codeword bits in parallel and accesses several super-parity-check matrices during one time unit. As described earlier, in one embodiment of bit flip decoding, a single bit is stored per each check node and a single bit is stored per each bit node. Each check node has a single bit of storage that stores a value corresponding to either "satisfied" or "unsatisfied". Each bit node has a single bit of storage that stores a codeword bit value (HD value). The bit nodes and check nodes are selectively interconnected according to a Tanner graph. Thus a single bit node is connected to several check nodes and a single check node is connected to several bit nodes.

In each iteration, the bit flip decoder performs check node to bit node updates and bit node to check node updates. In a check node to bit node update, check nodes connected to a bit node are polled and if more than a threshold number are unsatisfied, the bit in the bit node is flipped. The number of check nodes polled is equal to the number of check nodes connected to the bit nodes being processed. For example, if each bit node that is being processed is connected to three check nodes, an access to three different super-parity-check matrices is needed.

During a bit node to check node update, an XOR operation needs to be performed on all the bit node bits connected to the check node and the value of the check node is updated based on the result of the XOR. This updating may be done in a serial fashion, a semi-parallel fashion, or a parallel fashion. The bit flip decoder architecture described in FIGS. 6-8 enables all check nodes (e.g., all 3nx check nodes) connected to the bit nodes in a group of bit nodes (e.g., in a group of ny bit nodes) to be polled and updated in a single time unit. The update of check nodes in FIGS. 7-8 is assumed to be a serial update. A single time unit may be a clock cycle, several clock cycles, or a portion of a clock cycle.

FIG. 6 illustrates a functional block diagram of one embodiment of a bit flip decoder 600. The bit flip decoder includes a hard decision memory 610 that stores bit values for codeword bits that are represented by bit nodes in this description. The bit flip decoder 600 also includes two syndrome memories: a previous syndrome memory 620 and a current/partial-syndrome memory 625. The syndrome memories 620, 625 store values, called syndrome values, for the check nodes.

In each decoding iteration, during the check node to bit node update, a group of bit node values are retrieved from the hard decision memory 610 and check node values for check nodes connected to each of these bit nodes (called "neighboring check nodes") are polled from the previous syndrome memory 620. For instance, if a bit node is connected to three check nodes, three check node memory locations are accessed in the previous syndrome memory 620 in the same time unit. In other words, the previous syndrome memory 620 is read during the check node to bit node update, which is performed by an add/compare/flip logic 630. In this manner the add/compare/flip logic 630 is working from a stable memory that is not being changed by a subsequent bit node to check node update, which can be performed simultaneously. The add/compare/flip logic 630 flips any bit node bits that need to be flipped based on the syndrome values stored in the previous syndrome memory 620.

The bit node to check node update includes modifying the check node values (syndrome values) in the current syndrome memory 625, based, at least in part, on the bit node values In some instances, (e.g., when processing codewords stored on a solid state device (such as flash memory)), syndrome values (and bit node values) rarely change. Thus, the current syndrome memory 625 may be updated based on whether the decision was made to flip bits in the current time unit. If no bits were flipped in the current time unit, no update of the current syndrome memory 625 is needed.

A convergence monitor 640 monitors the previous syndrome memory 620 and/or current syndrome memory 625 to determine if the codeword bits have been successfully decoded. The current syndrome memory 625 is physically or logically copied into the previous syndrome memory 620 at the end of each full iteration of the bit-flip decoder, where one full iteration includes accessing each bit node once. This takes F time units, if the number of bits N in a codeword is N=F(ny).

The bit flip decoder 600 includes several power saving features. For example, as discussed above, a given check node value is only updated if a bit node bit connected to the check node is flipped. This can be seen in loop "a" in which the current bit node value is combined with the previous syndrome value. (In some embodiments, the current bit node value may be combined with the current syndrome value instead.) If no change has occurred in the syndrome values, loop "a" is disabled. In other words, if the current bit node value has not changed, no updates are made to the current syndrome memory 625. If a bit node value is flipped, then the decoder also follows loop "b" and updates the hard decision memory 610. If no bit node value is flipped in the current time unit, the hard decision memory 610 is not updated. Thus, power is saved by not updating syndrome or hard decision memories unless a bit is flipped, which is a relatively rare occurrence.

FIG. 7 outlines one embodiment of a method 700 that performs a decoder iteration on a group of bit nodes. At 720, a group of bit nodes is selected for processing. Bit nodes may be processed in natural order or any other order. At 730, the method includes polling neighboring check nodes connected to each bit node processing element. The check node values may be stored in the previous syndrome memory 620 (FIG. 6). Polling of the neighboring check nodes is performed substantially simultaneously. This simultaneous polling may be enabled by a specific LDPC code design that will be described with respect to FIG. 8. At 740, the method includes selectively updating values in the group of bit nodes based on the polling (e.g., bits in HD memory 610 in FIG. 6). At 750, the updated bit node values are sent to the neighboring check node neighbors. At 760, the method includes selectively updating a syndrome memory based on the updated bit node values. The syndrome memory updated in this step may be the current syndrome memory 625 (FIG. 6). If two syndrome memories (e.g., previous syndrome memory 620 and current syndrome memory 625) are used, the method includes copying the current syndrome memory into the previous syndrome memory at 770. This copying may be physical or logical.

FIG. 8 illustrates one embodiment of a syndrome memory 800 that is divided into separate memories to facilitate parallel processing of codeword bits as described in the method 700 of FIG. 7. The syndrome memory 800 is organized with Nr/M separate physical memories that each store syndrome values for a group of check nodes (shown as rows 0 to Nr−1, where Nr typically equals N−K). With proper code design, in any given update operation, no more than a single row from each memory group is accessed, preventing memory conflicts and simplifying hardware requirements. In one embodiment, the LDPC code parity check matrix is configured to include super-parity-check matrices such that each group of M rows in the LDPC code parity check matrix contains no more than one non-zero value in any given column. In one embodiment, M is equal to M=G·nx, where G is a positive integer greater than one and nx is the row size of each of the super-parity-check matrices. In another embodiment, the LDPC parity check matrix includes super-parity-check matrices, wherein each super-parity-check matrix comprises groups of adjacent rows in which each row corresponds to the same physical memory.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic", as used herein, includes but is not limited to hardware, firmware, instructions stored on a non-transitory medium or in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logics are described, it may be possible to incorporate the multiple logics into one physical logic. Similarly, where a single logic is described, it may be possible to distribute that single logic between multiple physical logics. One or more of the components and functions described herein may be implemented using one or more of the logic elements.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

To the extent that the term "includes" or "including" is employed in the detailed description or the claims, it is intended to be inclusive in a manner similar to the term "comprising" as that term is interpreted when employed as a transitional word in a claim.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

Previous Disclaimers Rescinded

Applicant respectfully informs the Patent Office that the present disclosure is a broadening continuation. Applicant rescinds all disclaimers made during the prosecution of the parent application(s), which may have included statements or amendments that may have disclaimed scope. Accordingly, the previous disclaimers, and the prior art that it was made to avoid, may need to be and should be re-visited.

What is claimed is:

1. An apparatus, comprising:
   a high throughput LDPC decoder configured to process no less than a first number of codeword bits in a single time unit, where the first number is equal to the product of n and y, further where n and y are natural numbers;
   a low throughput LDPC decoder configured to process no more than a second number of codeword bits in the single time unit, where the second number is equal to y, such that the low throughput LDPC decoder processes 1/n as many codeword bits in the single time unit as compared to the high throughput LDPC decoder;
   first logic configured to enable decoding of codeword bits by either the high throughput LDPC decoder or the low throughput LDPC decoder based on selection criteria.

2. The apparatus of claim 1, wherein the high throughput LDPC decoder is configured to access an entirety of a super-parity-check matrix to process codeword bits and the low throughput LDPC decoder is configured to access a portion of the super-parity-check matrix in the single time unit to process codeword bits, such that the low throughput LDPC decoder accesses less than the entirety of the super-parity-check matrix in the single time unit.

3. The apparatus of claim 1 wherein the high throughput LDPC decoder comprises a bit flip decoder that comprises:
   a hard decision memory storing codeword bit values;
   a previous syndrome memory storing syndrome values from an immediately prior decoding iteration;
   a current syndrome memory storing syndrome values calculated during a present decoding iteration; and
   second logic configured to, for a group of bit nodes storing n bit node bits, in the same decoding iteration:
      access the previous syndrome memory to poll the values of check nodes connected to bit nodes in the group of bit nodes;
      selectively flip bit node bits based, at least in part, on the values of check nodes stored in the previous syndrome memory;
      selectively update syndrome values in the current syndrome memory based, at least in part, on new values of the bit node bits; and
      selectively update codeword bit values in the hard decision memory based, at least in part, on the new values of the bit node bits.

4. The apparatus of claim 3, further comprising:
   third logic configured to determine, after each decoding iteration, whether the codeword bits have been successfully decoded; and
   wherein the second logic is further configured to, when the codeword bits are not successfully decoded, copy the check node values in the current syndrome memory into the previous syndrome memory.

5. The apparatus of claim 3, wherein the second logic is further configured to update the hard decision memory only when a bit node value is flipped.

6. The apparatus of claim 3, wherein the second logic is further configured to update a syndrome value in the current syndrome memory only when a value of a bit node connected to a check node corresponding to the syndrome value is flipped.

7. The apparatus of claim 3, wherein the current syndrome memory comprises m separate physical memories such that a first syndrome value stored in a first physical memory is accessible substantially simultaneously with accessing of a second syndrome value stored in the second physical memory.

8. The apparatus of claim 7, wherein the bit flip decoder is configured to access an LDPC code matrix that includes groups of adjacent rows in which each group of rows corresponds to a different physical memory and wherein each group of rows contains no more than one non-zero value in any given column.

9. A method, comprising:
  decoding codeword bits with a high throughput LDPC decoder configured to decode no less than a first number of codeword bits in a single time unit, where the first number is equal to a product of n and y, further where n and y are natural numbers; and
  when the decoding of the codeword bits with the high throughput LDPC decoder is unsuccessful, decoding the codeword bits with a low throughput LDPC decoder configured to decode no more than a second number of codeword bits in the single time unit, where the second number is equal to y, such that the low throughput LDPC decoder processes 1/n as many codeword bits in the single time unit as compared to the high throughput LDPC decoder.

10. The method of claim 9, wherein decoding the codeword bits with the high throughput LDPC decoder comprises:
  providing a hard decision memory configured to store codeword bit values;
  providing a previous syndrome memory configured to store syndrome values from an immediately prior decoding iteration;
  providing a current syndrome memory configured to store syndrome values calculated during a present decoding iteration; and
  for a group of bit nodes storing bit node bits, in the same decoding iteration:
    accessing the previous syndrome memory to poll the values of check nodes connected to bit nodes in the group of bit nodes;
    selectively flipping bit node bits based, at least in part, on the values of check nodes stored in the previous syndrome memory;
    selectively updating syndrome values in the current syndrome memory based, at least in part, on new values of the bit node bits; and
    selectively updating codeword bit values in the hard decision memory based, at least in part, on the new values of the bit node bits.

11. The method of claim 10, further comprising:
  determining, after each decoding iteration, whether the codeword bits have been successfully decoded; and
  when the codeword bits are not successfully decoded, copying the check node values in the current syndrome memory into the previous syndrome memory.

12. The method of claim 10, further comprising updating the hard decision memory only when a bit node value is flipped.

13. The method of claim 10, further comprising updating a syndrome value in the current syndrome memory only when a value of a bit node connected to a check node corresponding to the syndrome value is flipped.

14. The method of claim 9, wherein:
  decoding codeword bits with the high throughput LDPC decoder comprises accessing an entirety of a super-parity-check matrix; and
  decoding codeword bits with the low throughput LDPC comprises accessing a portion of the super-parity-check matrix in the single time unit, where the portion is less than the entirety of the super-parity-check matrix.

* * * * *